United States Patent
Kang et al.

(10) Patent No.: US 7,459,337 B2
(45) Date of Patent: Dec. 2, 2008

(54) METHOD OF FABRICATING BOTTOM GATE TYPE ORGANIC THIN FILM TRANSISTOR

(75) Inventors: Seung Youl Kang, Daejeon (KR); Seongdeok Ahn, Daejeon (KR); Chul Am Kim, Daejeon (KR); Meyoung Ju Joung, Daejeon (KR); Kyung Soo Suh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 492 days.

(21) Appl. No.: 11/009,831

(22) Filed: Dec. 10, 2004

(65) Prior Publication Data
US 2005/0142496 A1 Jun. 30, 2005

(30) Foreign Application Priority Data
Dec. 24, 2003 (KR) .................. 10-2003-0096220

(51) Int. Cl.
*H01L 51/40* (2006.01)
(52) U.S. Cl. .......................... 438/99; 257/40
(58) Field of Classification Search .............. 257/40; 438/99
See application file for complete search history.

(56) References Cited

U.S. PATENT DOCUMENTS 5,574,291 A 11/1996 Dodabalapur et al.
5,796,121 A * 8/1998 Gates ..................... 257/59
6,150,191 A 11/2000 Bao
7,202,495 B2 * 4/2007 Unno ..................... 257/40

FOREIGN PATENT DOCUMENTS

JP 2003-338629 11/2003
KR P2002-0084427 11/2002

OTHER PUBLICATIONS

Machine Translation of KR 10-2002-0084427.*
Machine Translation of JP 2003-338629.*
42nd Electronic Materials Conference Digest, pp. 24-25, Jun. 2000.
J. Vac. Sci. Technol. B 20(3), May/Jun. 2002, pp. 956-959.

* cited by examiner

*Primary Examiner*—Jerome Jackson, Jr.
*Assistant Examiner*—Anthony Ho
(74) *Attorney, Agent, or Firm*—Blakely, Sokoloff, Taylor & Zafman LLP

(57) ABSTRACT

A method of fabricating a bottom gate type organic thin film transistor is provided. The method includes the acts of: forming a gate conductive layer pattern on a substrate; forming a gate insulating layer on an exposed portion of the surface of the substrate and the gate conductive layer pattern; forming source/drain electrodes on the gate insulating layer to expose a portion of the surface of the gate insulating layer above on the gate conductive layer pattern; forming an organic semiconductor thin film on the exposed portion of the gate insulating layer; forming on the organic semiconductor thin film a passivation layer pattern exposing a portion of the surface of the organic semiconductor thin film; and forming an organic semiconductor thin film pattern by etching the exposed surface of the organic semiconductor thin film using the passivation layer pattern as an etch mask.

14 Claims, 6 Drawing Sheets

METHOD OF FABRICATING BOTTOM GATE TYPE ORGANIC THIN FILM TRANSISTOR

BACKGROUND OF THE INVENTION

This application claims the priority of Korean Patent Application No. 2003-96220, filed on Dec. 24, 2003, in the Korean Intellectual Property Office, the disclosure of which is incorporated herein in its entirety by reference.

1. Field of the Invention

The present invention relates to a method of fabricating an organic thin film transistor, and more particularly, to a method of fabricating a bottom gate type organic thin film transistor in which a gate conductive layer pattern is disposed below an organic semiconductor thin film pattern.

2. Description of the Related Art

Currently, inorganic thin film devices are being rapidly replaced by organic thin film devices due to improvements in technology and active research of organic thin film devices. Research and development of organic thin film transistors for realizing organic semiconductor devices has been the main reason for the change. An organic thin film transistor includes an organic semiconductor thin film as an active layer, and a gate conductive layer pattern for controlling the conductivity of an organic semiconductor thin film. A gate insulating layer is interposed between the organic semiconductor thin film and the gate conductive layer pattern, and source/drain electrodes are used as a path for an electric charge.

Organic thin film transistors are categorized into two types according to configuration. One is a top gate type in which a gate conductive layer pattern is formed on an organic semiconductor thin film pattern. The other is a bottom gate type in which a gate conductive layer pattern is formed on under an organic semiconductor thin film pattern. Bottom gate type organic thin film transistors are categorized into two types depending on the order of deposition used. One has a configuration in which a gate conductive layer pattern, a gate insulating layer, source/drain electrodes, and an organic semiconductor thin film pattern are deposited sequentially. The other has a configuration in which a gate conductive layer pattern, a gate insulating layer, an organic semiconductor thin film pattern, and source/drain electrodes are deposited sequentially.

To fabricate the top gate type organic thin film transistor, an organic semiconductor thin film pattern is formed and then a gate insulating layer is formed on the organic semiconductor thin film pattern. Forming a gate insulating layer having an excellent feature generally requires by a high-temperature process. However, generally, an organic semiconductor thin film pattern is not stable at a temperature over about 150° C. Thus, certain features can be deteriorated in an organic semiconductor thin film pattern during a high-temperature process for forming a good quality gate insulating layer. And since the surface morphology of the organic semiconductor is not good, the interface between organic semiconductor and gate insulator as a channel is not good and the characteristics of organic thin film transistor can be deteriorated. For these reasons, a bottom gate type organic thin film transistor is used more often than a top gate type organic thin film transistor.

But there are also several problems in fabricating a bottom gate type organic thin film transistor, too. For example, to form an organic semiconductor thin film pattern, an organic semiconductor thin film should be formed, and then the organic thin film should be patterned. Generally, a patterning process may be performed by forming a mask layer pattern on an object layer and etching the object layer using the mask layer pattern as an etch mask. The mask layer pattern is generally of a photoresist layer pattern. When forming a photoresist layer pattern on an organic semiconductor thin film and patterning the semiconductor thin film using the photoresist layer pattern, a solvent peels the organic semiconductor thin film off and rapidly deteriorates the characteristics of the organic semiconductor thin film. Thus, forming source/drain electrodes on an organic semiconductor thin film pattern becomes much more difficult.

A configuration in which an organic semiconductor thin film pattern is deposited on a gate insulating layer and source/drain electrodes are deposited on the organic semiconductor thin film pattern tends to have the best characteristics. When the organic semiconductor thin film pattern is formed on the gate insulating layer, grains in the organic semiconductor thin film pattern become larger, and thus a crystalline property is improved, thereby increasing the mobility of electrons or holes. When forming the source/drain electrodes on the organic semiconductor thin film pattern, a contact resistance formed between the source/drain electrodes and the organic semiconductor thin film pattern decrease, thereby improving the operation of an element.

SUMMARY OF THE INVENTION

The present invention provides a method of fabricating a bottom gate type organic thin film transistor with excellent properties by patterning an organic semiconductor thin film in order to prevent deterioration of characteristics of the organic semiconductor thin film. Also, the present invention provides a method of fabricating a bottom gate type organic thin film transistor in which source/drain electrodes are formed above an organic semiconductor thin film pattern without damaging the organic semiconductor thin film pattern.

According to an aspect of the present invention, there is provided a method of fabricating a bottom gate type organic thin film transistor, the method including the acts of: forming a gate conductive layer pattern on a substrate; forming a gate insulating layer on an exposed portion of the surface of the substrate and the gate conductive layer pattern; forming source/drain electrodes on the gate insulating layer except for a portion of the surface of the gate insulating layer above on the gate conductive layer pattern; forming an organic semiconductor thin film on the exposed portion of the surface of the gate insulating layer; forming on the organic semiconductor thin film a passivation layer on the organic semiconductor thin film; and forming an organic semiconductor thin film pattern by etching the organic semiconductor thin film using the passivation layer pattern as an etch mask.

The organic semiconductor thin film may be composed of a polymer organic semiconductor and a small molecule organic semiconductor.

The acts of forming the passivation layer pattern may include: forming a passivation layer on the organic semiconductor thin film; and patterning the passivation layer such that a portion of the organic semiconductor thin film is exposed.

The passivation layer may be composed of a mixture in which a lubricant oil and a polymer dissolved in the lubricant oil are mixed.

The polymer may include natural rubber, rubber of isoprene group, and rubber of butylene group.

The passivation layer may be composed of a mixture in which a lubricant oil and an organic dissolved in the lubricant oil are mixed.

The organic may comprise a monomer of a polymer.

The passivation layer may further include a photoinitiator polymerizing the monomer.

The passivation layer may be formed by spin coating, dip coating, and casting.

The lubricant oil may be an inert liquid that does not react with the organic semiconductor thin film.

The lubricant oil may include silicone oil, mineral oil, and paraffin oil.

According to another aspect of the present invention, there is provided a method of fabricating a bottom gate type organic thin film transistor, the method including the acts of: forming a gate conductive layer pattern on a substrate; forming a gate insulating layer on an exposed portion of the surface of the substrate and the gate conductive layer pattern; forming an organic semiconductor thin film on the gate insulating layer; forming on the organic semiconductor thin film a first passivation layer pattern exposing a portion of the surface of the organic semiconductor thin film; forming an organic semiconductor thin film layer pattern by etching the exposed portion of the surface of the organic semiconductor thin film using the first passivation layer pattern as an etch mask; removing the first passivation layer pattern and forming a second passivation layer covering the organic semiconductor thin film pattern; forming a mask layer pattern on the second passivation layer; forming a second passivation layer pattern by etching a portion of the second passivation layer using the mask layer pattern as an etch mask; forming a metal layer on the organic semiconductor thin film pattern and the mask layer pattern; and forming source/drain electrodes above the organic semiconductor thin film pattern by removing portions of the metal layer above the mask layer pattern and the mask layer pattern simultaneously.

The mask layer pattern may be a photoresist layer pattern.

The portion of the metal layer formed above the mask layer pattern may be removed by a lift-off process.

According to another aspect of the present invention, there is provided a method of fabricating a bottom gate type organic thin film transistor, the method including the acts of: forming a gate conductive layer pattern on a substrate; forming a gate insulating layer on an exposed portion of the surface of the substrate and the gate conductive layer pattern; forming an organic semiconductor thin film on the gate insulating layer pattern; forming on the organic semiconductor thin film a first passivation layer pattern exposing an portion of the surface of the organic semiconductor thin film; forming an organic semiconductor thin film pattern by etching the exposed portion of the organic semiconductor thin film using the first passivation layer pattern as an etch mask; forming a second passivation layer covering the first passivation layer pattern and the organic semiconductor thin film pattern; forming a mask layer pattern on the second passivation layer; forming a second passivation layer pattern and removing a portion of the first passivation layer pattern by etching the second passivation layer and the portion of the first passivation layer pattern; forming a metal layer on the organic semiconductor thin film pattern and the mask layer pattern; and forming source/drain electrodes above the organic semiconductor thin film pattern by removing portions of the metal layer above the mask layer pattern and the mask layer pattern simultaneously.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein.

FIGS. 1 through 4 illustrate a method of fabricating a bottom gate type organic thin film transistor according to an embodiment of the present invention.

Figure 1:
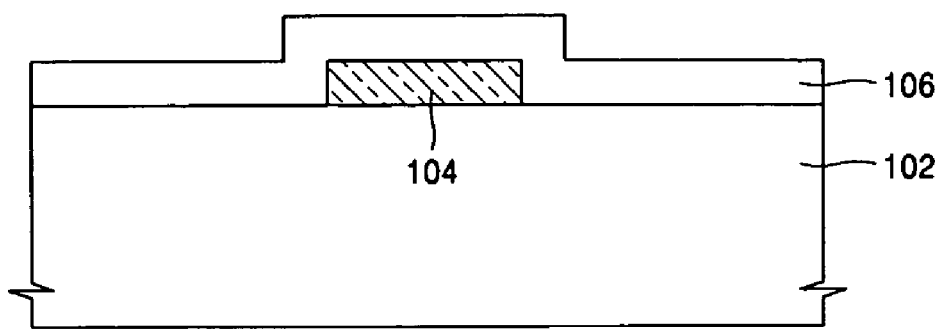
FIGS. 1 through 4 illustrate a method of fabricating a bottom gate type organic thin film transistor according to an embodiment of the present invention.

Referring to FIG. 1, a gate conductive layer pattern 104 is formed on a substrate 102. The substrate 102 may be composed of plastic, glass or silicon. The gate conductive layer pattern 104 may be composed of a metal or a conducting polymer. A metal layer or a conducting polymer layer is formed on the substrate and a mask layer pattern (not shown) exposing a portion of the surface of the metal layer or conducting polymer layer is formed on the metal layer or conducting polymer layer. Then the exposed portion of the metal layer or conducting polymer layer is removed by an etch process, using the mask layer pattern as a etch mask. After forming the gate conductive layer pattern 104 as described above, the mask layer pattern is removed. Next, a gate insulating layer 106 is formed on the substrate 102 and the gate conductive layer pattern 104. The gate insulating layer 106 may include an inorganic thin film including a silicon oxide layer and a silicon nitride layer, or a thin film including a polymer layer. After forming the gate insulating layer 106, a pad (not shown) for connecting a gate electrode to the gate conductive layer pattern 104 is formed.

Figure 2:
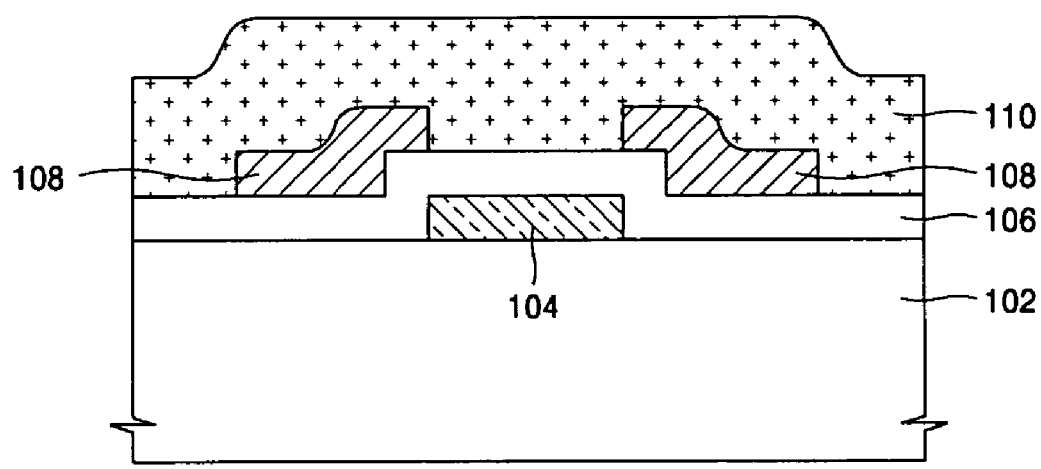

Referring to FIG. 2, source/drain electrodes 108 are formed on the gate insulating layer 106. The source/drain electrodes 108 may be composed of a metal, and may be a metal with a large work function such as gold (Au), platinum (Pt), or palladium (Pd). A conducting polymer layer with a great work function may also form the source/drain electrodes 108. In order to form the source/drain electrodes 108, first, a metal layer or a conducting polymer layer is formed on the insulating layer 106. Then, a mask layer pattern (not shown) exposing a portion of the surface of the metal layer or conducting polymer layer is formed on the metal layer or conducting polymer layer. Then the exposed portion of the metal layer or conducting polymer layer is removed by an etch process using the mask layer pattern as an etch mask, and the source/drain electrodes 108 exposing a portion of the surface of the gate insulating layer 106 are formed. After the source/drain electrodes 108 are formed, the mask layer pattern is removed. If a metal layer on which an etch process may be difficult to perform is used, a lift-off method may be used.

In the lift-off method, a photoresist pattern layer exposing a portion of the surface on which the metals for the source/drain electrodes 108 are deposited using an electron beam vapour deposition method is formed, and the photoresist pattern layer is removed together with the metal layer formed on the photoresist pattern layer.

Next, an organic semiconductor thin film 110 is formed on the exposed portion of the gate insulating layer 106 and the source/drain electrodes 108. The organic semiconductor thin film 110 is composed of a small molecule organic semiconductor and, if the transistor is to be applied to a device not requiring a high-speed operating frequency, the organic semiconductor thin film 110 may be composed of a polymer organic semiconductor. When a small molecule organic semiconductor such as pentacene or hexathienylene is used, a vacuum deposition method is used. The polymer organic semiconductor may be 3-hexythiophene (P3HT) or fluorine-bithiophene copolymer (F8T2).

Figure 3:
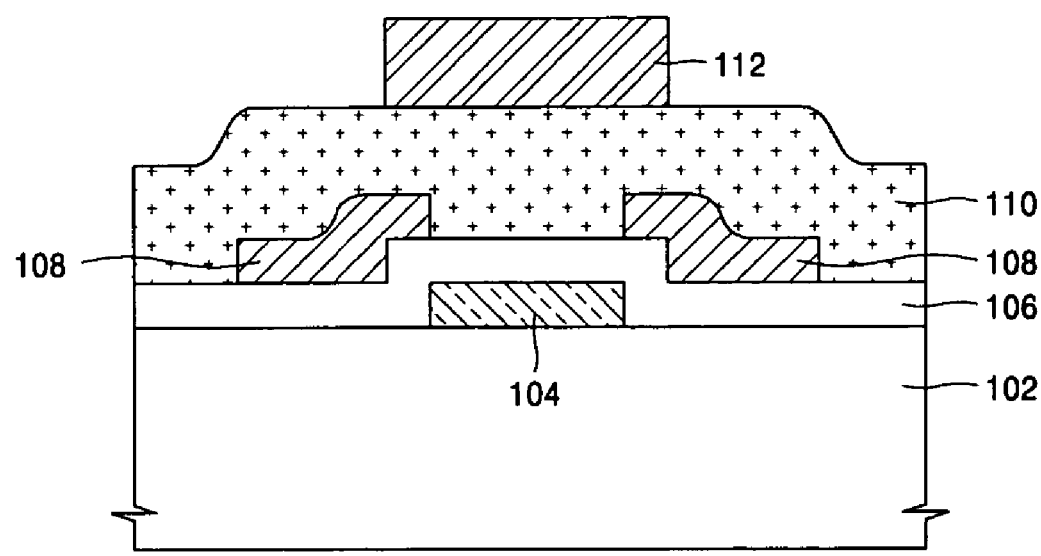

Referring to FIG. 3, a passivation layer pattern 112 is formed on the organic semiconductor thin film 110. A passivation layer is formed on the organic semiconductor thin film 110, and is patterned such that the passivation layer pattern 112 covers a portion of the surface of the organic semiconductor thin film 110. The passivation layer may be formed such that a lubricant oil used as an inert liquid does not damage or degrade the organic semiconductor thin film 110. An organic material or a polymer that may be dissolved in the lubricant oil are mixed, and then the mixture is spin-coated, dip-coated or casted on the organic semiconductor thin film 110 in the form of a thin film form. The lubricant oil may be silicone oil, mineral oil, or paraffin oil. A monomer of general polymers is used as organic material mixed in the lubricant oil. In this case, the passivation layer pattern 112 may be formed by directly exposing and patterning the passivation layer without using a photoresist layer if a photoinitiator is added to the mixture of monomer and lubricant oil. If the photoinitiato is not added, the patterning process may be performed using a photoresist layer pattern. Isoprene rubber, butane rubber, or butylenes rubber that may be dissolved in the lubricant oil may be used as the polymer mixed in the lubricant oil.

Figure 4:
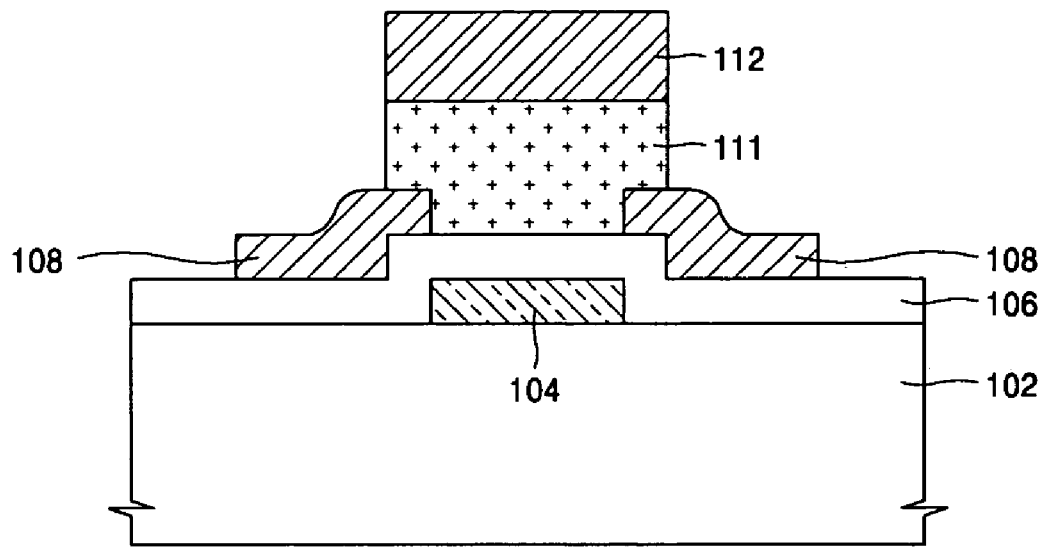

Referring to FIG. 4, an organic semiconductor thin film pattern 111 is formed by etching the organic semiconductor thin film 110 using the passivation layer pattern 112 as an etch mask. The etching may be dry etching using plasma or wet etching using an organic solvent.

Figure 5:
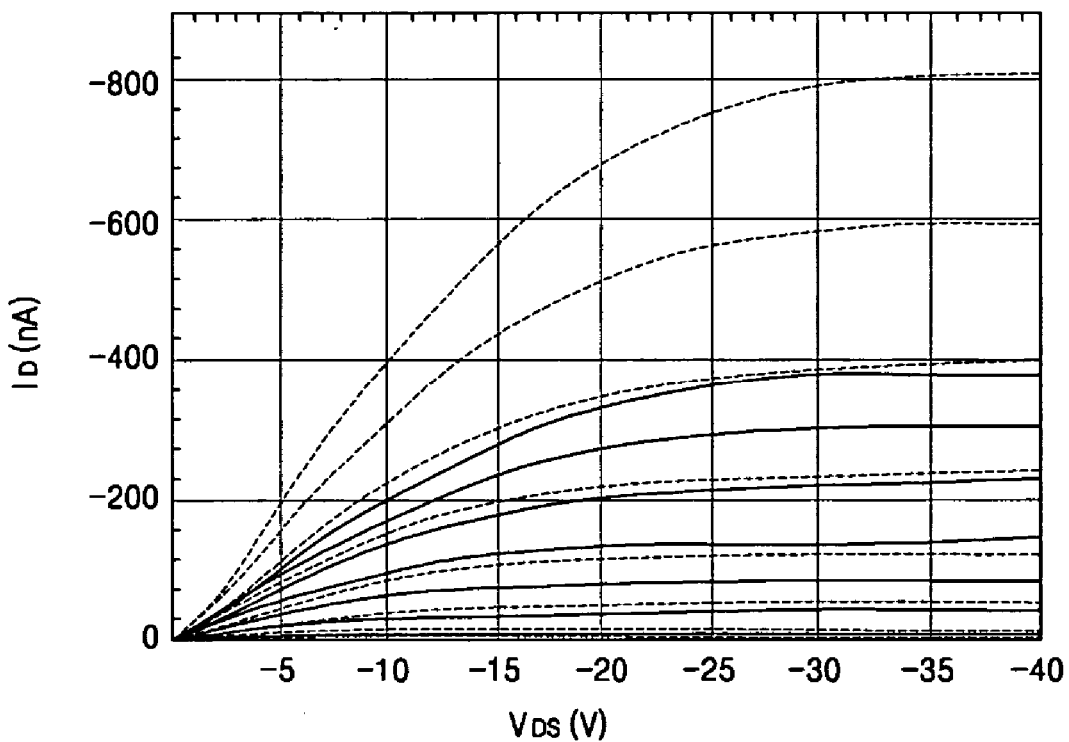
FIG. 5 is a graph illustrating current-voltage characteristics of an organic thin film transistor fabricated using a method of fabricating a bottom gate type organic thin film transistor according to an embodiment of the present invention and a conventional organic thin film transistor.

FIG. 5 is a graph illustrating current-voltage characteristics of an organic thin film transistor fabricated using a method of fabricating a bottom gate type organic thin film transistor according to an embodiment of the present invention and a conventional organic thin film transistor.

Referring to FIG. 5, an organic thin film transistor including the passivation layer pattern 112, formed using a method according to an embodiment of the present invention (indicated by solid lines in FIG. 5) maintains the device characteristics of a transistor, although a quantity of current is slightly less than that of an organic thin film transistor not including a passivation layer pattern (shown in dotted lines in FIG. 5). The decrease in the current is caused by heat treatment process performed after forming of the passivation layer pattern 112, which can be avoided by using a low temperature during the heat treatment.

FIGS. 6 through 11 are cross-sectional views illustrating a method of fabricating a bottom gate type organic thin film transistor according to another embodiment of the present invention. The method of fabricating the bottom gate type organic thin film transistor according to the present embodiment is different from that of the previous embodiment in that the source/drain electrodes are formed above an organic semiconductor thin film.

Figure 6:
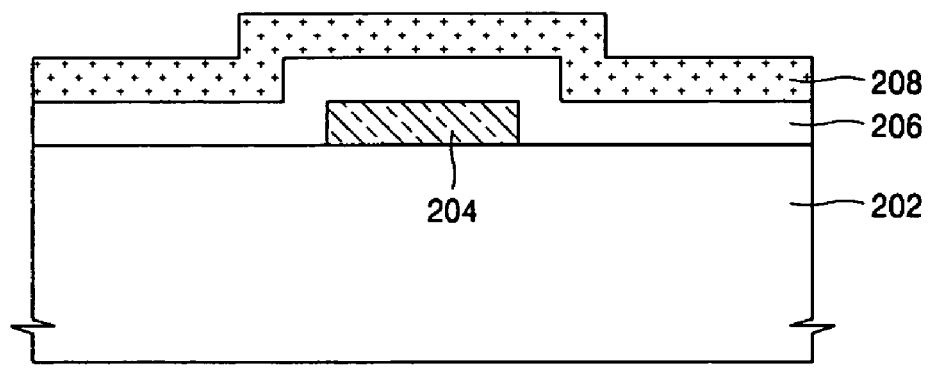
FIGS. 6 through 11 illustrate a method of fabricating a bottom gate type organic thin film transistor according to another embodiment of the present invention.

Referring to FIG. 6, a gate conductive layer pattern 204 is formed on a substrate 202. The substrate 202 may be composed of plastic, glass or silicon. The gate conductive layer pattern 204 may be formed of a metal layer or a conducting polymer layer. Since a method of forming the gate conductive layer pattern 204 according the present embodiment is the same as that described above with reference to FIG. 1, a description thereof will be omitted herein. After forming the gate conductive layer pattern 204, a gate insulating layer 206 is formed on the substrate 202 and gate conductive layer pattern 204. The gate insulating layer 206 may be an inorganic thin film including a silicon oxide layer and a silicon nitride layer, or a thin film composed of a polymer.

Next, an organic semiconductor thin film 208 is formed on the gate insulating layer 206. The organic semiconductor thin film 208 may be composed of a small molecule organic semiconductor and, if the transistor is to be applied to a device not requiring a high-speed operating frequency, a polymer organic semiconductor layer may be used. When a small molecule organic semiconductor layer such as pentacene or hexathienylene is used, a vacuum deposition method is used. The polymer organic semiconductor may be P3HT or F8T2.

Figure 7:
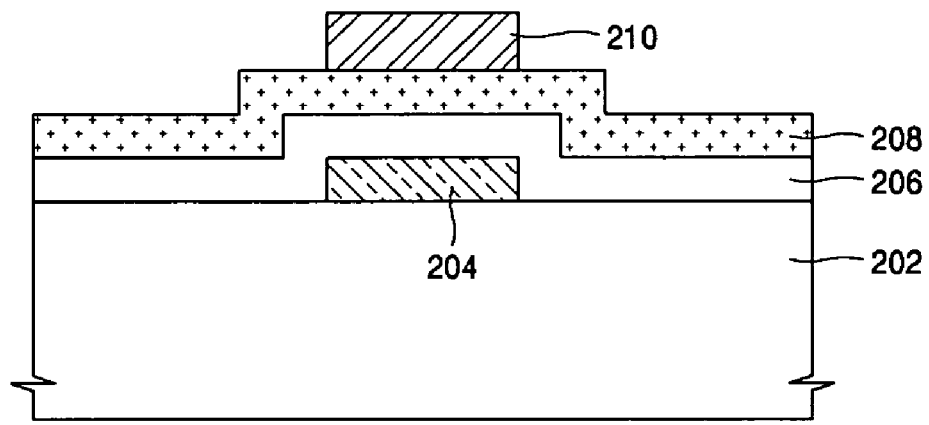

Referring to FIG. 7, a first passivation layer pattern 210 is formed on the organic semiconductor thin film 208. First, a first passivation layer is formed on the organic semiconductor thin film 208, and is patterned to cover a portion of the organic semiconductor thin film 208. The first passivation layer may be formed such that a lubricant oil used as an inert liquid does not damage or degrade the organic semiconductor thin film 208. An organic material or a polymer that can be dissolved in the lubricant oil is mixed, and then the mixture is spin-coated, dip-coated or casted on the organic semiconductor thin film 208 as a thin film. The lubricant oil may be silicone oil, mineral oil, or paraffin oil. A monomer of general polymers is used as organic mixed in the lubricant oil. In this case, the first passivation layer pattern 210 may be formed by directly exposing and patterning the first passivation layer without using a photoresist layer if a photoinitiator that can polymerize the monomer is added to the mixture of the monomer and lubricant oil. When the photoinitiator is not added, the patterning process may be performed using a photoresist layer pattern. Isoprene rubber, butane rubber, and butylenes rubber that may be dissolved in the lubricant oil may be used as the polymer mixed in the lubricant oil.

Figure 8:
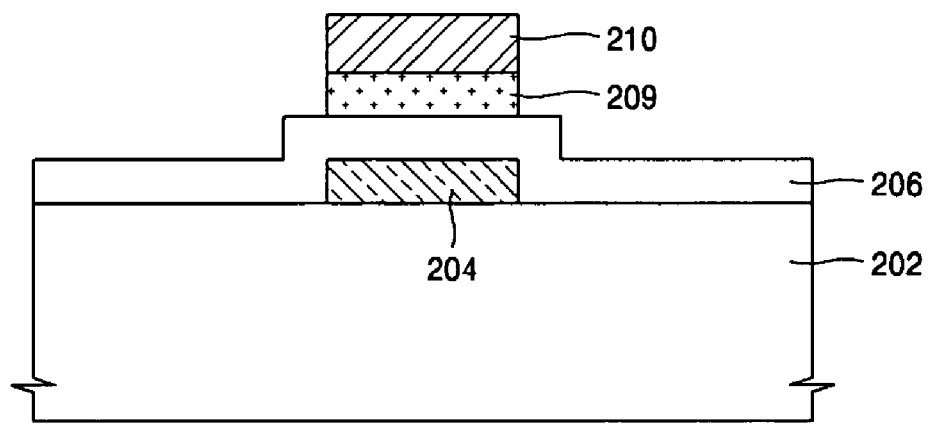

Referring to FIG. 8, an organic semiconductor thin film pattern 209 is formed by etching the organic semiconductor thin film 208 using the first passivation layer pattern 210 as an etch mask. The etching may be dry etching using plasma or wet etch using an organic solvent. After forming the semiconductor thin film pattern 209, the first passivation layer pattern 210 is completely removed using oil for dissolving the same. Thus, the gate insulating layer 206 and the organic semiconductor thin film pattern 209 are exposed.

Figure 9:
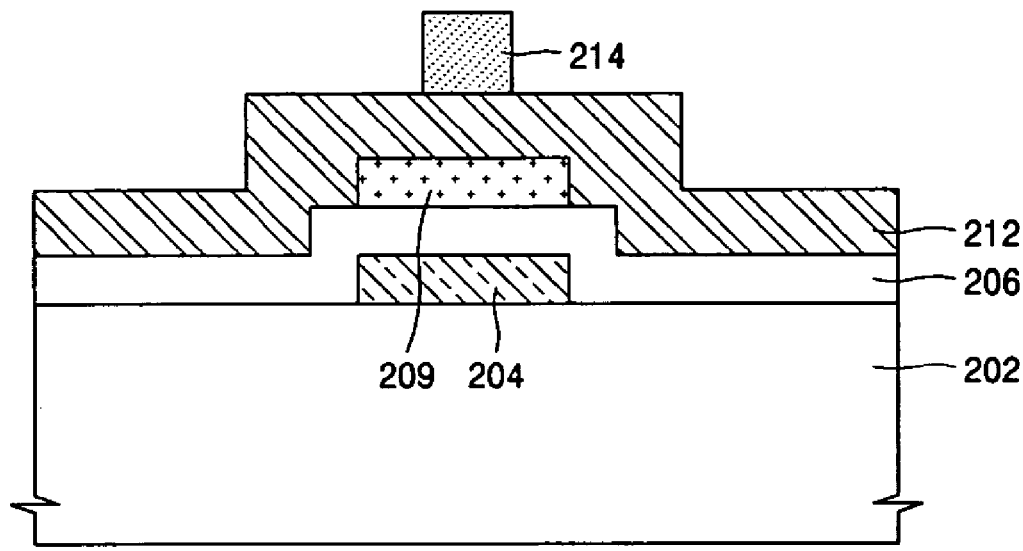

Referring to FIG. 9, a second passivation layer 212 is formed to cover the semiconductor thin film pattern 209. The second passivation layer 212 is composed of the same material and formed using the same method as the first passivation layer. Next, a mask layer pattern 214 for a lift-off process is formed on the second passivation layer 212. The mask layer pattern 214 is a general photoresist layer pattern. Next, the mask layer pattern 214 is wet etched to remove an exposed portion of the second passivation layer 212. Then, a second passivation layer pattern (213 of FIG. 10) exposing a portion of the organic semiconductor thin film pattern 209 is formed.

Figure 10:
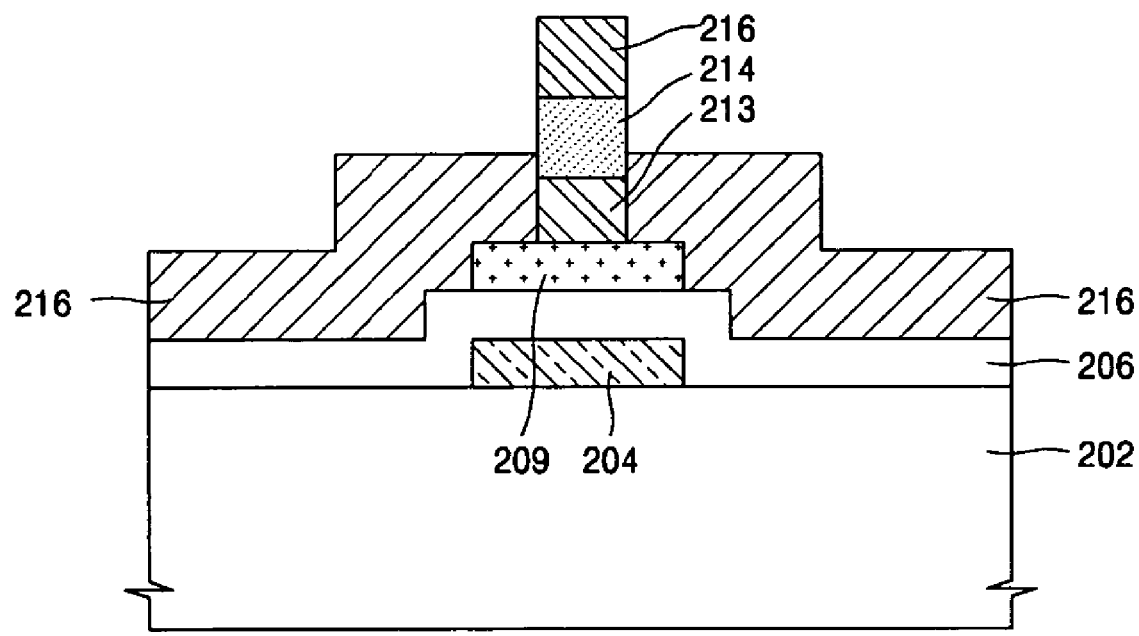

Referring to FIG. 10, a metal layer 216 for forming source/drain electrodes is formed on the entire surface. The metal layer 216 is formed on the gate insulating layer 206, the semiconductor thin film pattern 209, the second passivation layer pattern 213, and the mask layer pattern 214. Next, a lift-off process for removing the metal layer 216 formed on the mask layer pattern 214 by removing the mask layer pattern 214 is performed.

Figure 11:
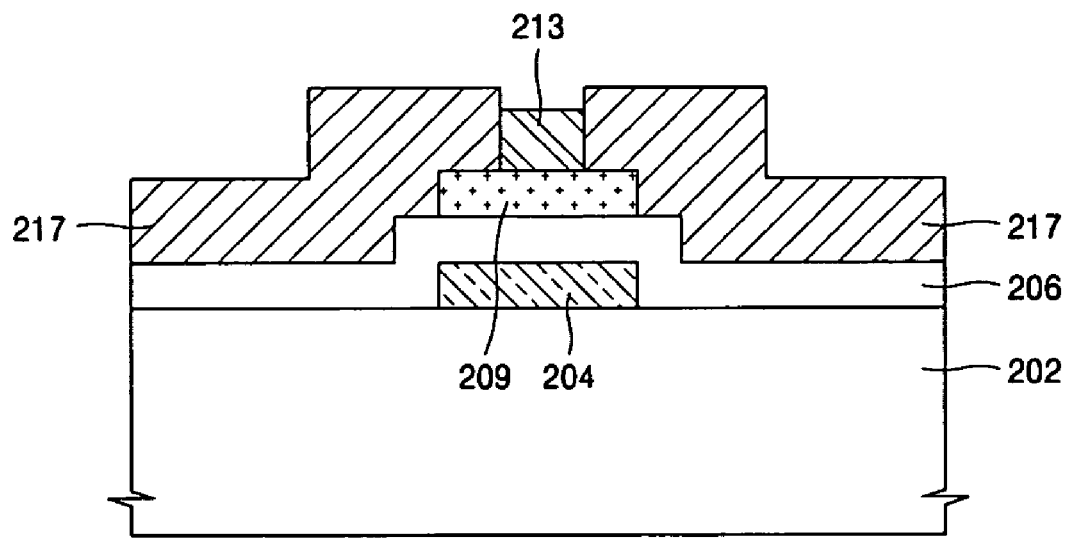

Thus, a bottom gate type organic thin film transistor in which source/drain electrodes 217 are formed above the semiconductor thin film pattern 209 is fabricated, as shown in FIG. 11.

Figure 12:
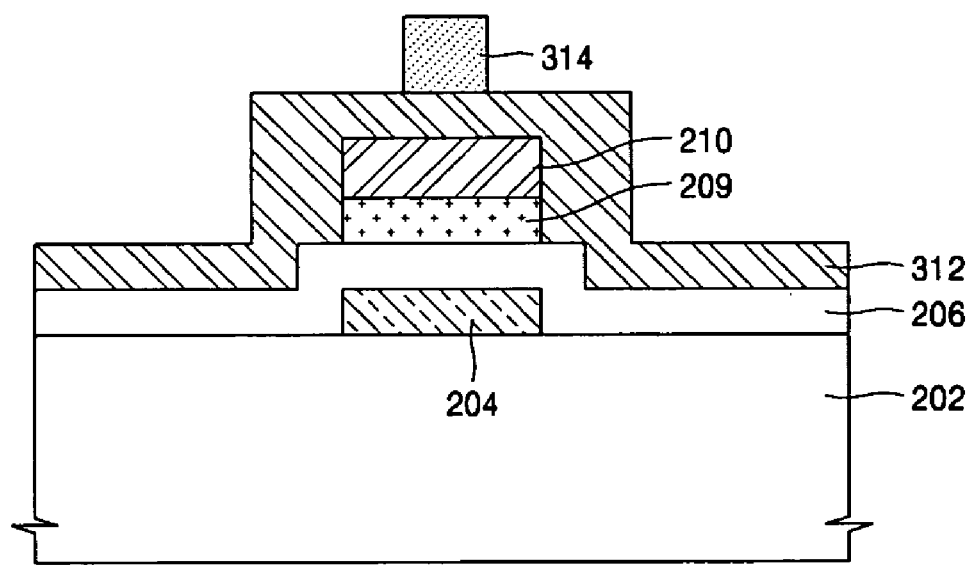
FIGS. 12 and 13 illustrate a method of fabricating a bottom gate type organic thin film transistor according to still another embodiment of the present invention
Figure 13:
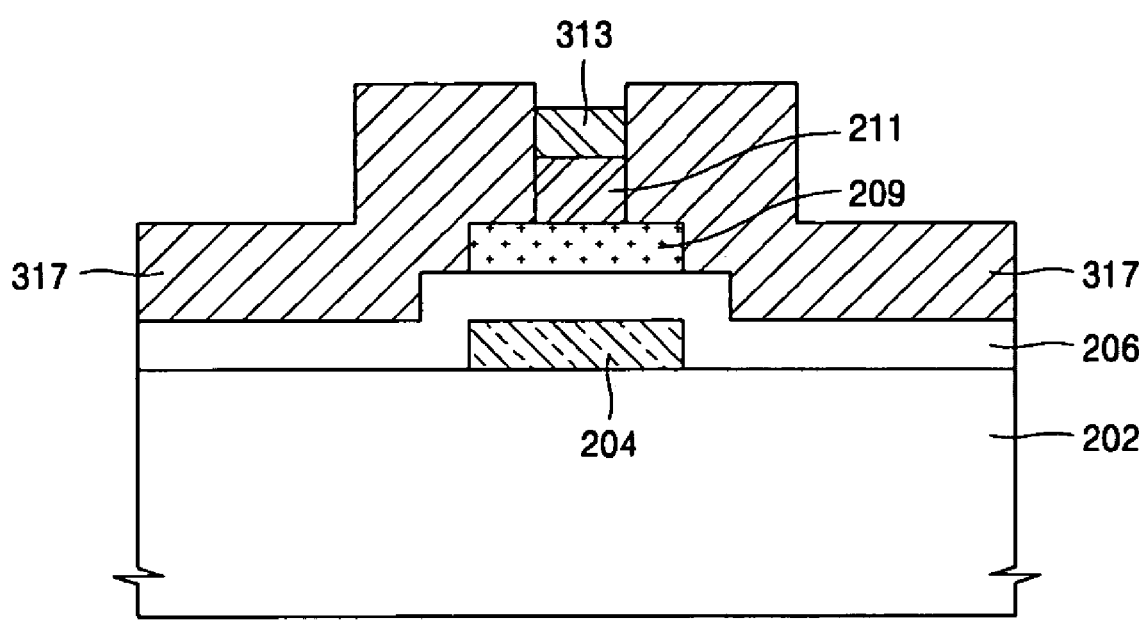

FIGS. 12 and 13 illustrate a method of fabricating a bottom gate type organic thin film transistor according to another embodiment of the present invention. The method of fabricating a bottom gate type organic thin film transistor according to the present embodiment is similar to the method of fabricating the transistor with the configuration in which source/drain electrodes are formed above a semiconductor thin film as described above referring to FIGS. 6 through 11. Reference numerals shown in FIGS. 12 and 13 which are the same those in FIGS. 6 through 11 illustrate the same elements.

First, referring to FIG. 12, the semiconductor thin film pattern 209 and the first passivation layer pattern 210, as shown in FIG. 8, are sequentially deposited by performing the same processes as described above with reference to FIGS. 6 through 8. Next, a second passivation layer 312 covering the organic semiconductor thin film pattern 209 and the first passivation layer pattern 210 is formed without removing the first passivation layer pattern 210. Next, a mask layer pattern 314 for a lift-off process is formed on the second passivation layer pattern 312. The mask layer pattern 314 is a general photoresist layer pattern.

Referring to FIG. 13, an exposed portion of the second passivation layer 312 and part of the first passivation layer pattern 210 are sequentially removed using the mask layer pattern 314 as an etch mask. Thus, the first passivation layer pattern 211, of which a portion is removed, and a second passivation layer pattern 313, are sequentially deposited on the organic semiconductor thin film pattern 209 and expose a portion of the organic semiconductor thin film pattern 209. Next, a metal layer for forming source/drain electrodes is formed on the entire surface. The metal layer is formed on the gate insulating layer 206, the organic semiconductor thin film pattern 209, the first passivation layer pattern 211 of which the portion is removed, the second passivation layer pattern 313, and the mask layer pattern (314 of FIG. 12). Next, a lift-off process for removing the metal layer formed on the mask layer pattern 314 by removing the mask layer pattern 314 is performed. Thus, a bottom gate type organic thin film transistor in which source/drain electrodes 317 are formed above the semiconductor thin film pattern 209 is fabricated.

As described above, in a method of fabricating a bottom gate type organic thin film transistor according to an embodiment of the present invention, an organic semiconductor thin film is patterned without deteriorating characteristics of the organic semiconductor thin film. More specially, source/drain electrodes are formed above an organic semiconductor thin film pattern without deteriorating the characteristics of the organic semiconductor thin film. Furthermore, since various integrated circuits may be fabricated using the organic thin film transistor, the organic thin film transistor may be applied to a switching element of a liquid crystal display, a switching element of an organic light emitting diode, a smart card, or a radio frequency identity card.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a bottom gate type organic thin film transistor, the method comprising the acts of:
   forming a gate conductive layer pattern on a substrate;
   forming a gate insulating layer on an exposed portion of the surface of the substrate and the gate conductive layer pattern;
   forming source/drain electrodes on the gate insulating layer to expose a portion of the surface of the gate insulting layer above on the gate conductive layer pattern;
   forming an organic semiconductor thin film on the exposed portion of the surface of the gate insulating layer;
   forming on the organic semiconductor thin film a passivation layer pattern exposing a portion of the surface of the organic semiconductor thin film; and
   forming an organic semiconductor thin film pattern by etching the exposed surface of the organic semiconductor thin film using the passivation layer pattern as an etch mask,
   wherein the passivation layer pattern is composed of a mixture in which a lubricant oil comprising silicone oil, mineral oil or paraffin oil is mixed with a polymer or an organic melted in the lubricant oil.

2. The method of claim 1, wherein the organic semiconductor thin film may be composed of a polymer organic semiconductor and a small molecule organic semiconductor.

3. The method of claim 1, wherein the act of forming the passivation layer pattern comprises:
   forming a passivation layer on the organic semiconductor thin film; and
   forming the passivation layer pattern by patterning the passivation layer such that a portion of the organic semiconductor thin film is exposed.

4. The method of claim 1, wherein the polymer comprises natural rubber, rubber of isoprene group, and rubber of butylene group.

5. The method of claim 1, wherein the organic comprises a monomer of a polymer.

6. The method of claim 5, wherein the passivation layer further comprises a photoinitiator polymerizing the monomer.

7. The method of claim 3, wherein the passivation layer is formed by spin coating, dip coating, or casting.

8. A method of fabricating a bottom gate type organic thin film transistor, the method comprising the acts of:
   forming a gate conductive layer pattern on a substrate;
   forming a gate insulating layer on an exposed portion of the surface of the substrate and the gate conductive layer pattern;
   forming source/drain electrodes on the gate insulating layer to expose a portion of the surface of the gate insulating layer above on the gate conductive layer pattern;
   forming an organic semiconductor thin film on the exposed portion of the surface of the gate insulating layer;
   forming on the organic semiconductor thin film a passivation layer pattern exposing a portion of the surface of the organic semiconductor thin film; and forming an organic semiconductor thin film pattern by etching the exposed surface of the organic semiconductor thin film using the passivation layer pattern as an etch mask, wherein the passivation layer pattern is composed of a mixture in which a lubricant oil is mixed with a polymer comprising rubber, rubber of isoprene group, or rubber of butylene group or an organic melted in the lubricant oil are mixed.

9. The method of claim 8, wherein the organic semiconductor thin film is composed of a polymer organic semiconductor selected from the group consisting of a high polymer organic semiconductor and a low polymer organic semiconductor.

10. The method of claim 8, wherein the act of forming the passivation layer pattern comprises:

forming a passivation layer on the organic semiconductor thin film; and forming the passivation layer pattern by patterning the passivation layer such that a portion of the organic semiconductor thin film is exposed.

11. The method of claim 8, wherein the organic comprises a monomer of a polymer.

12. The method of claim 11, wherein the passivation layer further comprises a photoinitiator polymerizing the monomer.

13. The method of claims 10, wherein the passivation layer is formed by spin coating, deep coating, or casting.

14. The method of claims 8, wherein the lubricant oil is an inert liquid that does not react with the organic semiconductor thin film.

* * * * *